(12) United States Patent
Kurosawa

(10) Patent No.: US 8,196,545 B2
(45) Date of Patent: Jun. 12, 2012

(54) DEVICE AND METHOD FOR MANUFACTURING A SEMICONDUCTOR WAFER

(75) Inventor: Yoshiaki Kurosawa, Omura (JP)

(73) Assignee: Sumco Techxiv Corporation, Omura-shi, Nagasaki-ken (JP)

( * ) Notice: Subject to any disclaimer, the term of this patent is extended or adjusted under 35 U.S.C. 154(b) by 0 days.

(21) Appl. No.: 12/426,532

(22) Filed: Apr. 20, 2009

(65) Prior Publication Data

US 2009/0269861 A1    Oct. 29, 2009

(30) Foreign Application Priority Data

Apr. 25, 2008    (JP) ................... 2008-116166

(51) Int. Cl.
*B05C 11/00*    (2006.01)
*H01L 21/66*    (2006.01)
*C23F 1/08*     (2006.01)
*B24B 49/02*    (2006.01)

(52) U.S. Cl. 118/712; 156/345.24; 438/5; 257/E21.529; 118/708; 427/8; 427/9

(58) Field of Classification Search .......... 118/708, 118/712, 665, 668, 669; 355/77, 55, 72, 355/53; 156/345.24; 438/5, 281; 451/8; 257/E21.529; 427/8, 9
See application file for complete search history.

(56) References Cited

U.S. PATENT DOCUMENTS

| | | | | |
|---|---|---|---|---|
| 3,845,738 A | * | 11/1974 | Berkman et al. | 118/725 |
| 6,733,618 B2 | * | 5/2004 | Kagoshima et al. | 156/345.24 |
| 6,914,000 B2 | * | 7/2005 | Kamada | 438/692 |
| 2003/0049390 A1 | * | 3/2003 | Shanmugasundram et al. | 427/585 |
| 2004/0063263 A1 | * | 4/2004 | Suzuki et al. | 438/197 |
| 2004/0185662 A1 | * | 9/2004 | Fujisawa et al. | 438/689 |
| 2005/0267607 A1 | * | 12/2005 | Paik | 700/31 |
| 2007/0042567 A1 | * | 2/2007 | Koyata et al. | 438/459 |

FOREIGN PATENT DOCUMENTS

| JP | 19-94132 A1 | 4/2007 |
|---|---|---|
| JP | 2007-94132 A1 | 4/2007 |

* cited by examiner

*Primary Examiner* — Yewebdar Tadesse
(74) *Attorney, Agent, or Firm* — JTT Patent Services, LLC; Gerald T. Peters

(57) ABSTRACT

In order to manufacture an epitaxial wafer having satisfactory flatness over its entire surface, epitaxial layers are experimentally grown upon actual wafer samples under various different layer formation conditions, the thickness profiles are measured over the entire surfaces of these wafers before and after growth of the layers, and, from the differences thereof, layer thickness profiles over the entire areas of the epitaxial layers under the various different layer formation conditions are ascertained and stored. Thereafter, the thickness profile of a substrate wafer is measured over its entire area, this is added to each of the layer thickness profiles under the various different layer formation conditions which have been stored, and the planarities of the manufactured wafers which would be manufactured under these various different layer formation conditions are predicted. And one set of processing conditions is selected which is predicted to satisfy a required flatness specification, and an epitaxial layer is actually grown upon the substrate wafer under these processing conditions.

12 Claims, 11 Drawing Sheets

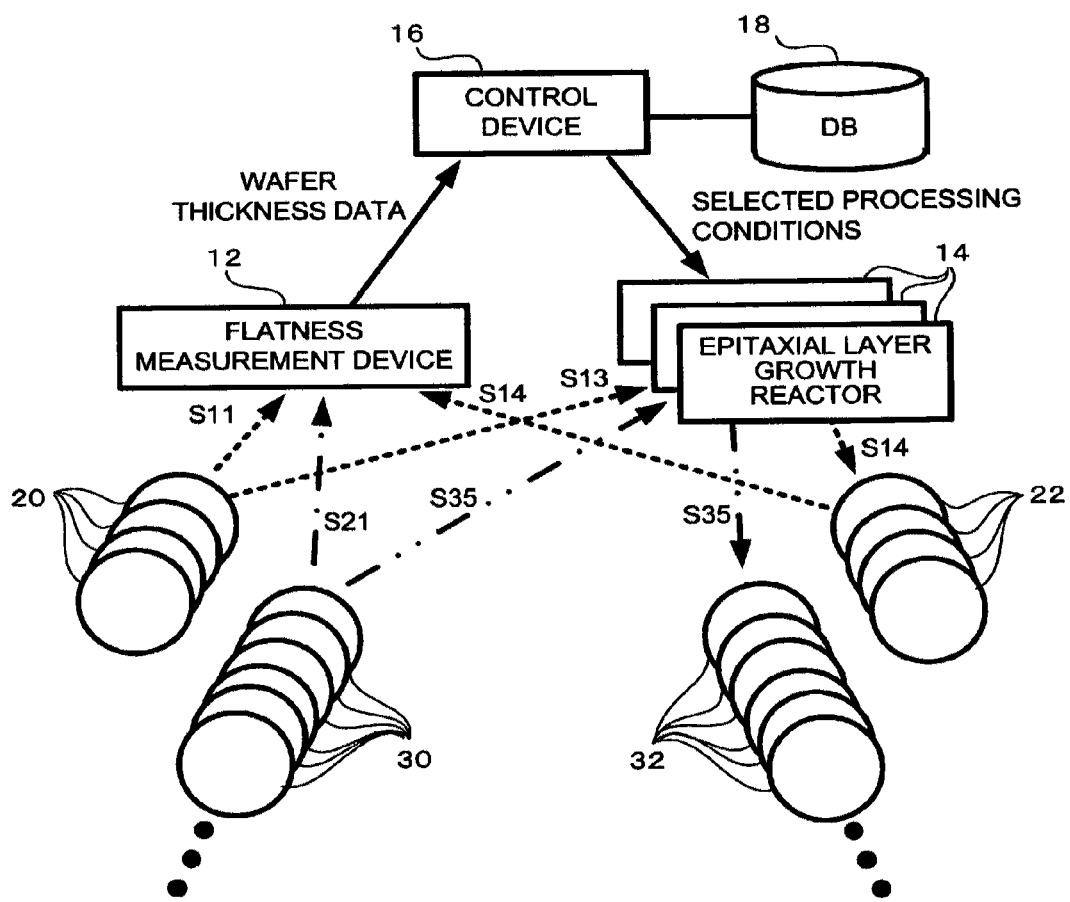

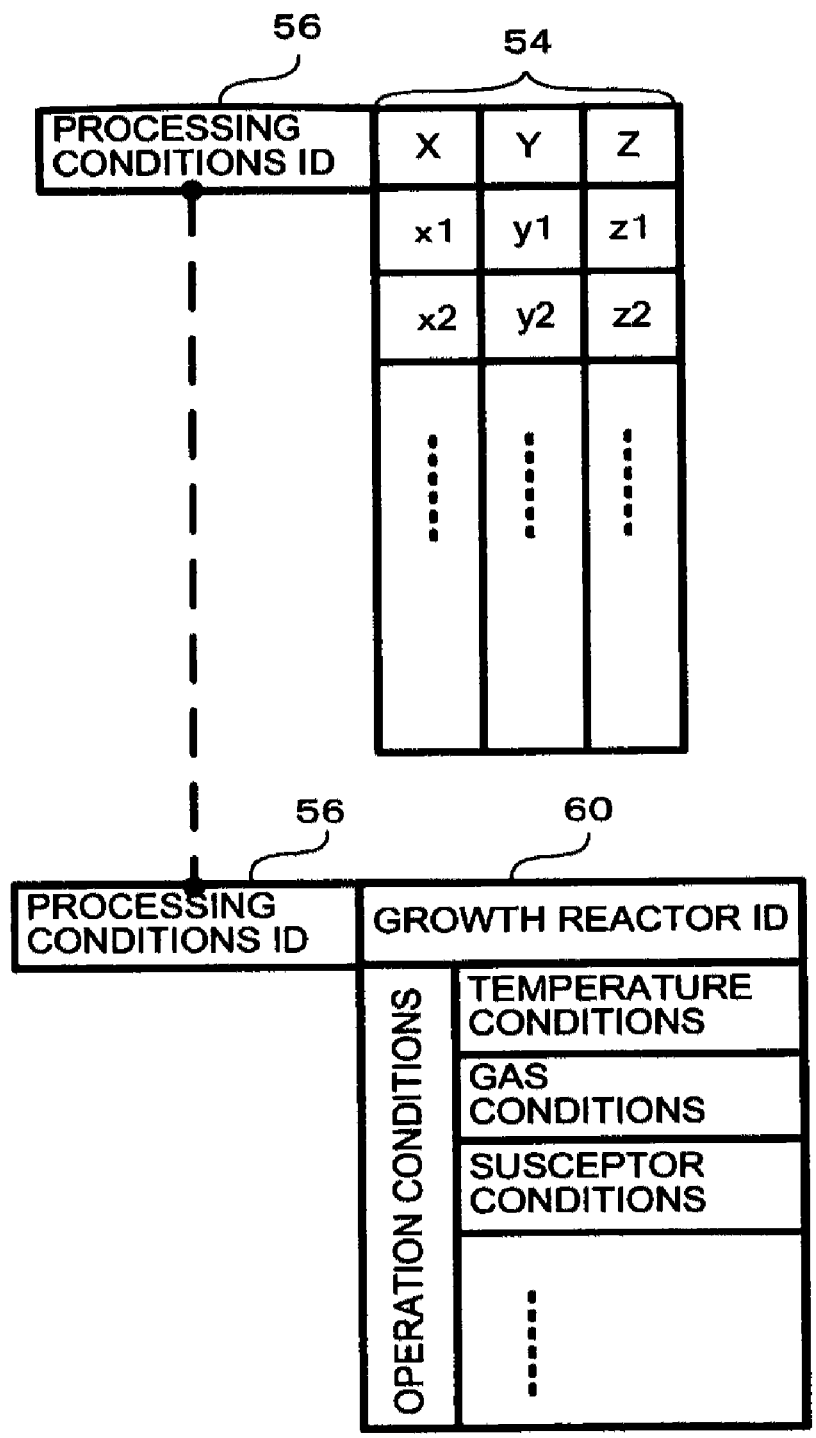

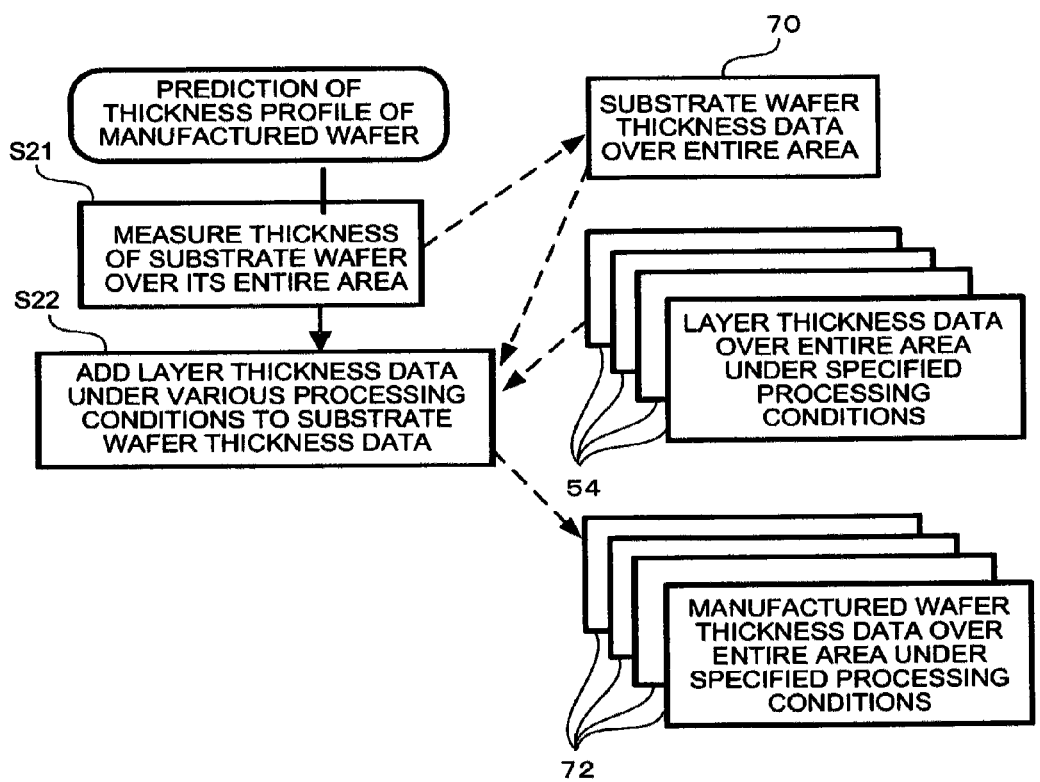

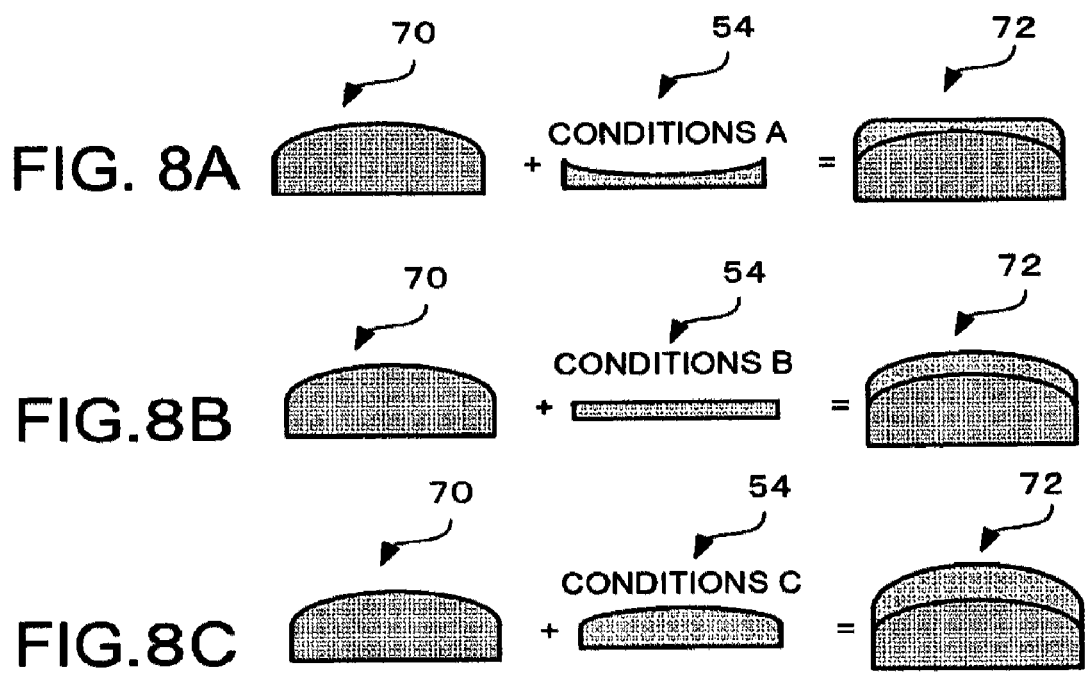

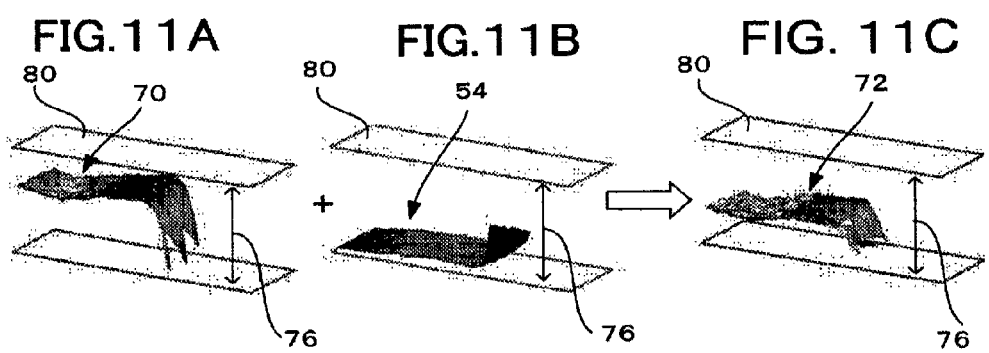

DEVICE AND METHOD FOR MANUFACTURING A SEMICONDUCTOR WAFER

CROSS REFERENCE TO RELATED APPLICATIONS

This application relates to and claims priority from Japanese Patent Application No. 2008-116166 filed on Apr. 25, 2008, the entire disclosure of which is incorporated herein by reference.

FIELD OF THE INVENTION

The present invention generally relates to a device and method for manufacturing a semiconductor wafer, and in particular relates to a technique for enhancing the flatness of a wafer which is manufactured via a process such as growth of an epitaxial layer or surface etching or the like.

BACKGROUND OF THE INVENTION

An example will be taken of manufacture of an epitaxial wafer by growing an epitaxial layer upon a substrate wafer. The flatness of the resulting epitaxial wafer may be determined by adding the thickness of the epitaxial layer to the shape of the surface of the substrate wafer. If there are variations in the flatness of the substrate wafer and for the thickness distribution of the epitaxial layer, then variations occur in the flatness of the final manufactured product. In order to manufacture an epitaxial wafer of high flatness, then increase of the flatness of the substrate wafer and increase in the uniformity of the epitaxial layer thickness are required. However, since it is difficult to obtain an ideal state for both of these, an effective method has been to combine the surface shape of the substrate wafer with a layer thickness profile which is matched thereto, as described in Patent Reference #1.

Patent Reference #1: Japanese Patent Publication 2007-94132.

According to a method of combining concave shapes and convex shapes as disclosed in Patent Reference #1, it is possible to improve the flatness over the use of a random method. However, since there are various types of shape of substrate wafers for different wafers, variation of the flatness occurs even when combination like that described above is performed. For example, if the characteristics of the shape of the substrate wafers are determined by lot units, then it is not possible to cancel out variations in flatness due to differences in the shapes of different wafers within the same lot.

Furthermore, according to the invention disclosed in Patent Document #1, while it is possible to select the combination which yields the highest flatness, it is not known whether or not it has been possible to satisfy the required flatness specification.

Yet further, according to the invention disclosed in Patent Reference #1, attention is only given to the flatness at the border portion of the wafer. However, the flatness at regions other than the border portion also changes according to growth of the epitaxial layer. Thus, the invention disclosed in Patent Reference #1 is unsatisfactory from the point of view of enhancing the flatness over the entire area of the wafer.

Related problems are not limited only to flatness when growing an epitaxial layer upon a wafer; they are present in relation to changes of the surface shape of a wafer which occur along with various types of processing, such as bending of a wafer along with layer growth, change of the shape of the surface of the wafer when that surface is ground or etched, and the like.

Accordingly, the object of the present invention is to enhance the surface profile of a manufactured semiconductor wafer over substantially its entire area.

SUMMARY OF THE INVENTION

A manufacturing device according to one aspect of the present invention includes: a storage means which stores a plurality of sets of processing amount data which specify respective processing amounts over substantially the entire area of a wafer under a plurality of sets of processing conditions; a substrate wafer measurement means which obtains substrate wafer surface shape data by measuring the shape of a substrate wafer over substantially its entire area; a manufactured wafer prediction means which, by applying each of the plurality of sets of processing amount data to the substrate wafer surface shape data, calculates a plurality of sets of manufactured wafer surface shape data, each of which specifies predicted values for surface shape of a manufactured wafer over substantially its entire area, which would be obtained if the substrate wafer were to be processed under the plurality of sets of processing conditions; a processing conditions selection means which evaluates the plurality of sets of processing conditions on the basis of the plurality of sets of manufactured wafer surface shape data, and selects one set of processing conditions according to the result of the evaluation; and a wafer processing means which manufactures a manufactured wafer by processing the substrate wafer under the selected processing conditions.

With this semiconductor wafer manufacturing device, before the actual processing of a substrate wafer, the anticipated surface shapes of the manufactured wafers which would be obtained if that substrate wafer were to be processed under each of a plurality of different sets of processing conditions are predicted, and, on the basis of these predictions, one set of processing conditions among the plurality of sets of processing conditions can be selected which satisfies some demand. And the actual processing is performed under these selected processing conditions. Accordingly, it is possible to produce a manufactured wafer which has a satisfactory surface shape over its entire area.

And, in addition to the structure described above, a semiconductor wafer manufacturing device according to a preferred embodiment further includes: a substrate wafer sample measurement means which obtains a plurality of substrate wafer surface shape data by measuring the surface shapes of a plurality of substrate wafer samples over substantially their entire areas; a sample processing means which manufactures a plurality of manufactured wafer samples by processing each of the plurality of substrate wafer samples under one of the plurality of sets of processing conditions; a manufactured wafer sample measurement means which obtains a plurality of sets of manufactured wafer surface shape data by measuring the surface shapes of the plurality of substrate wafer samples over substantially their entire areas; and a processing amount calculation means which calculates the plurality of sets of processing amount data from the plurality of sets of substrate wafer surface shape data and the plurality of sets of manufactured wafer surface shape data.

With this added structure, this semiconductor wafer manufacturing device is able to measure the processing amounts under the above described plurality of sets of processing conditions.

With a semiconductor wafer manufacturing device according to a preferred embodiment, on the basis of the plurality of sets of manufactured wafer surface shape data, the processing condition selection means calculates a plurality of corresponding surface shape evaluation values, and selects the one set of processing conditions which satisfy the predetermined surface shape specification by comparing the plurality of calculated surface shape evaluation values with a predetermined surface shape specification.

By doing this, it is possible reliably to manufacture a manufactured wafer which satisfies a predetermined surface shape specification.

As a more concrete structure, a semiconductor wafer manufacturing device according to a preferred embodiment includes a flatness measurement device which can measure wafer thickness; an epitaxial layer growth reactor which operates under set processing conditions; and a control device for inputting output data from the flatness measurement device, and controlling the epitaxial layer growth reactor, And the flatness measurement device functions as the substrate wafer measurement means. Moreover, the epitaxial layer growth over functions as the wafer processing means. Furthermore, the control device functions as the storage means, the manufactured wafer prediction means, and the processing conditions selection means.

Examples of the type of processing to which the present invention may be applied are growth of an epitaxial layer upon a wafer or grinding or etching or the like of the surface of a wafer. In the case of growth of an epitaxial layer, it is possible, for example, to employ the thickness profile of the wafer as the above described surface shape of the wafer, and it is possible, for example, to employ the thickness profile of the epitaxial layer as the above described processing amount. Moreover, in the case of grinding or etching, it is possible, for example, to employ the thickness profile of the wafer as the above described surface shape of the wafer, and it is possible, for example, to employ the amount of processing the amount of processing by grinding or etching as the above described processing amount.

And a method for manufacturing a semiconductor wafer according to another aspect of the present invention includes: a storage step of storing a plurality of sets of processing amount data which specify respective processing amounts over substantially the entire area of a wafer under a plurality of sets of processing conditions; a substrate wafer measurement step of obtaining substrate wafer surface shape data by measuring the shape of a substrate wafer over substantially its entire area; a manufactured wafer prediction step of, by applying each of the plurality of sets of processing amount data to the substrate wafer surface shape data, calculating a plurality of sets of manufactured wafer surface shape data, each of which specifies predicted values for surface shape of a manufactured wafer over substantially its entire area, which would be obtained if the substrate wafer were to be processed under the plurality of sets of processing conditions; a processing condition selection step of evaluating the plurality of sets of processing conditions on the basis of the plurality of sets of manufactured wafer surface shape data, and selecting one set of processing conditions according to the result of the evaluation; and a wafer processing step of manufacturing a manufactured wafer by processing the substrate wafer under the selected processing conditions.

According to a preferred embodiment of the present invention, the profile of the surface of a manufactured semiconductor wafer is improved over substantially its entire area.

BRIEF DESCRIPTION OF THE DRAWINGS

FIG. 1 is a block diagram showing the overall structure of a semiconductor wafer manufacturing device according to an embodiment of the present invention;

FIG. 6 is a figure showing an example of the structure of layer thickness data and processing conditions data which are held in mutual correspondence in a database;

FIG. 7 is a figure showing the flow of processing in the step S3 of actual manufacturing processing shown in FIG. 3, in other words processing for predicting the thickness profile of the manufactured wafer under various different processing conditions;

FIG. 8 is a figure graphically showing processing for predicting the thickness profile of the manufactured wafer;

FIG. 11 is a figure in which attention is directed at a single site, and graphically shows substrate wafer thickness data 70 measured in a step S21 of FIG. 7, epitaxial layer thickness data 54 under some processing conditions measured in a step S15 of FIG. 4, and manufactured wafer thickness data 72 under the same processing conditions predicted in a step S22 of FIG. 7.

DESCRIPTION OF AN EMBODIMENT OF THE INVENTION

Figure 2A:
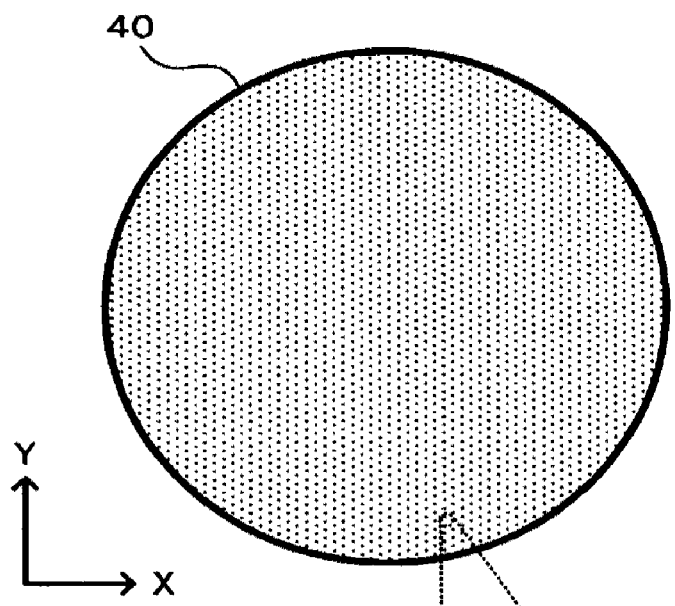
FIG. 2 is a figure showing an arrangement of measurement points for wafer thickness measurement by a flatness measurement device.

A semiconductor wafer manufacturing device according to an embodiment of the present invention will now be explained with reference to the drawings.

FIG. 1 shows the overall structure of a semiconductor wafer manufacturing device according to an embodiment of the present invention.

As shown in FIG. 1, this semiconductor wafer manufacturing device 10 comprises a flatness measurement device 12, one or more epitaxial layer growth reactors 14, 14, and a control device 16. The flatness measurement device 12 is a device for measuring the surface shape of a semiconductor wafer which is loaded thereinto—in this embodiment, its thickness profile. The epitaxial layer growth reactors 14 are devices for growing epitaxial layers upon the front surfaces of semiconductor wafers which are loaded thereinto. The control device 16 is a device for acquiring the thickness profiles of the semiconductor wafers as measured by the flatness measurement device 12, and for controlling the epitaxial growth reactors 14, 14 . . . on the basis thereof. This control device 16 incorporates a database 18.

Figure 2B:
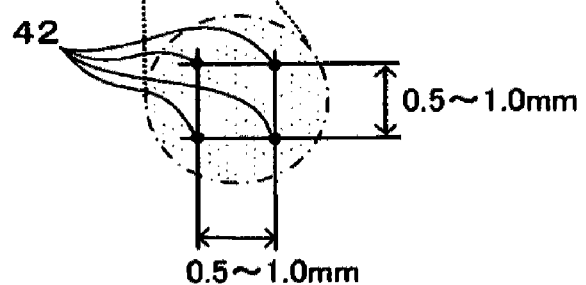

FIG. 2A shows an example of a large number of positions upon a semiconductor wafer (hereinafter termed "measurement points") at which the thickness of the semiconductor wafer is measured by the flatness measurement device 12. And FIG. 2B shows a small region upon this semiconductor wafer as magnified.

In FIG. 2A, a large number of very small points which are distributed over the entire area of a wafer 40 are shown, which constitute a large number of measurement points. Normally, the diameter of the wafer 40 is of the order of 20 cm to 30 cm, while the gap between neighboring measurement points 42, 42, . . . may be, for example, of the order of 0.5 mm to 1.0 mm in both the X coordinate direction and the Y coordinate direction, as shown magnified in FIG. 2B. In this manner, the thickness of the wafer 40 is measured at the large number of measurement points 42, 42, . . . which are arranged over the entire area of the wafer 40 at an extremely high density. Accordingly, the set of the measured values for the thickness at all of the measurement points 42, 42, . . . (hereinafter termed the wafer thickness data), outputted from the flatness measurement device 12, specifies the thickness profile of the wafer 40 over substantially its entire area.

Figure 3:
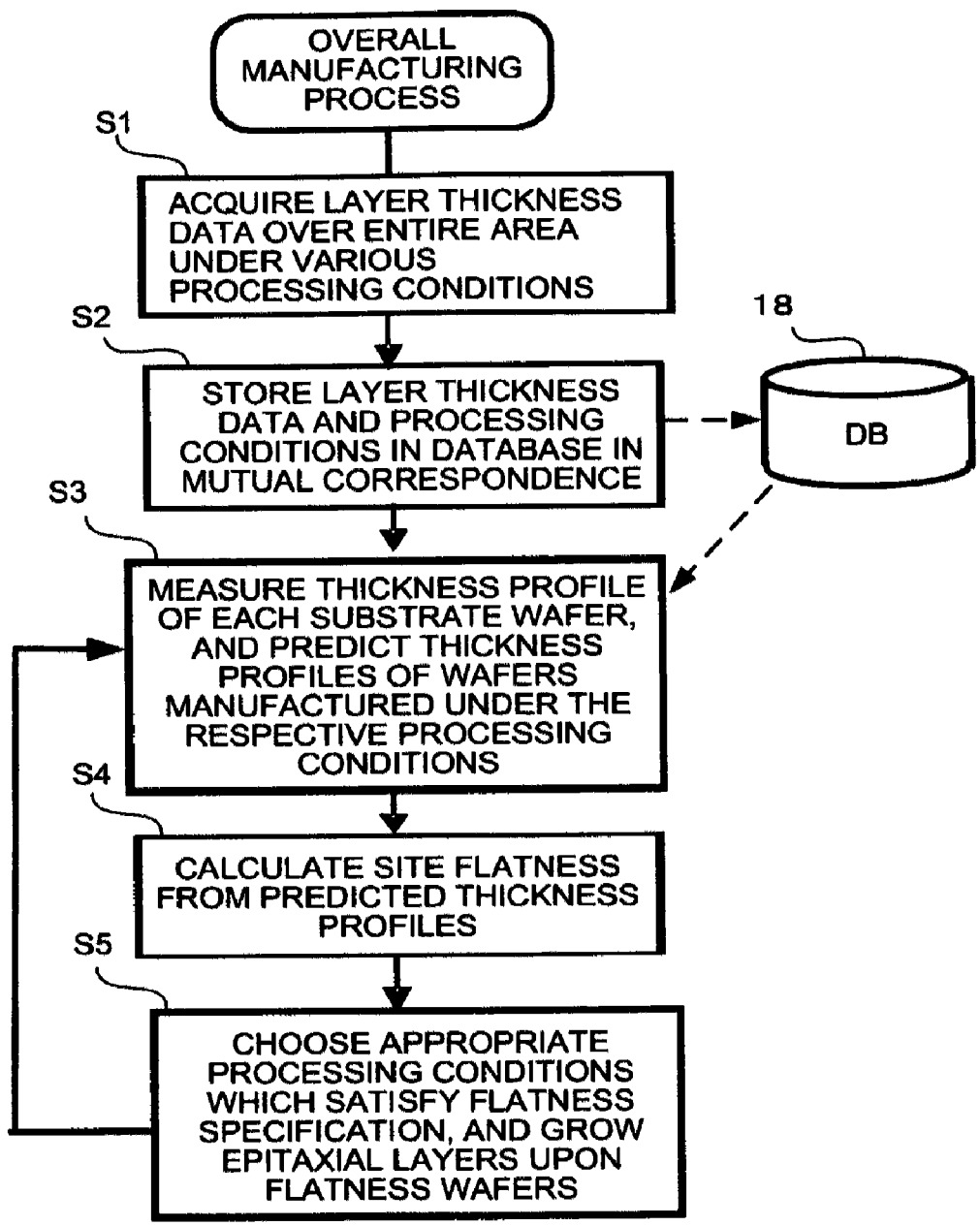
FIG. 3 is a figure showing the overall flow of the epitaxial wafer manufacturing processing which is performed by the semiconductor wafer manufacturing device shown in FIG. 1.

FIG. 3 shows the overall flow of the epitaxial wafer manufacturing process which is performed by the semiconductor wafer manufacturing device 10 shown in FIG. 1.

Broadly speaking, the overall manufacturing process shown in FIG. 3 may be considered as being divided into two stages. The first stage, which consists of the steps S1 and S2, is preparatory processing. The second stage, which consists of the steps S3 through S5, is the process of actually manufacturing the epitaxial wafer.

In the preparatory processing, under various processing conditions, information is acquired about the processing amount, in other words about the layer thickness of the epitaxial layer itself (i.e. about the thickness of just the epitaxial layer by itself, not including the wafer thickness).

First, in the step S1, under a plurality of different processing conditions, for testing, epitaxial layers are formed upon semiconductor wafers upon which no such layers have yet been formed (hereinafter termed "substrate wafers") And the thickness profiles of these epitaxial layers which have been formed under different processing conditions are measured (the concrete details of the method for doing so will be described hereinafter). By doing this, layer thickness data is acquired for the epitaxial layers under various different processing conditions. And, in the step S2, this layer thickness data under various different processing conditions which has been acquired is stored in the database 18.

Here "processing conditions" means the conditions for controlling the processing of the substrate wafer (in this embodiment, growth of the epitaxial layer). Accordingly, in this embodiment, "processing conditions" includes the operational conditions of the epitaxial layer growth reactor 14 (for example, temperature conditions such as the temperature change curve, susceptor conditions such as the type and the shape and the rotational speed and so on of the susceptor, gas conditions such as the type and the density and the flow rate of the gas, and the like). In addition thereto, if a plurality of epitaxial layer growth reactors 14, 14, . . . can be employed, then the above described "processing conditions" include the selection of which of these epitaxial layer growth reactors 14 is to be used. The epitaxial layer grows at a constant layer thickness which is determined by the processing conditions. Accordingly, the layer thickness data which has been obtained by the preparatory processing can be applied to a substrate wafer having any type of thickness profile.

In the actual manufacturing processing after the preparatory processing, one or more (normally, a large number of) epitaxial wafers (hereinafter termed "manufactured wafers") are made as manufactured products. At this time, by applying the epitaxial layer thickness data in various different processing conditions which has been acquired during the preparatory processing to the thickness profile of each substrate wafer by calculation, the processing conditions for growth of an epitaxial layer which is suitable for each substrate wafer are selected so that the flatness of each of the manufactured wafers becomes satisfactory according to requirements.

In other words, in the actual manufacturing process, the processing of the steps S3 through S5 is performed upon one or more prepared substrate wafers (normally, a large number thereof), one by one.

First, in the step S3, measurement of the thickness profile of each of the substrate wafers is performed, and the wafer thickness data of that substrate wafer is obtained. And the corresponding different epitaxial layer thickness data in the database 18 under different processing conditions is added to these sets of wafer thickness data. The various different sets of wafer thickness data which have been obtained by this addition process mean the predicted results (i.e. the anticipated values) of the thickness profiles of the different manufactured wafers, which will be obtained if respective epitaxial layers are grown upon these substrate wafers under the above described different processing conditions.

Next, in the step S4, using the wafer thickness data of the manufactured wafers as forecast under the above described different processing conditions, flatness evaluation values are calculated which are similar to that used in a flatness test of the manufactured wafer (for example, SFQR (Site flatness Front reference least sQuare Range). In other words, the flatness which would result by application of the above described different processing conditions is predicted, before actually performing the layer formation processing.

Here, as the site flatness, instead of or in combination with the above described SFQR, it would also be acceptable to arrange to utilize SFQD (Site flatness-Front reference least sQuare Deviation), SBIR (Site flatness Back reference Ideal Range), SBID (Site flatness Back reference Ideal Deviation), SFLR (Site flatness Front reference Least square Range), or SFLD (Site flatness Front reference Least square Deviation) or the like, either singly or in combination.

Next, in the step S5, on the basis of the flatness values evaluated under different processing conditions which have been calculated as described above, one set of processing conditions is selected which can satisfy some required flatness specification (for example, which includes an acceptable value of site flatness, the minimum value of a yield ratio (flatness yield ratio) at which the site flatness better than the acceptable value is yielded, etc.). And an epitaxial layer is formed upon this substrate wafer using these selected processing conditions (i.e. using the specified epitaxial growth reactor 14 and the specified operational conditions).

In the following, each of the sub-processes S1 through S5 in the overall process described above will be explained in more detail.

Figure 4:
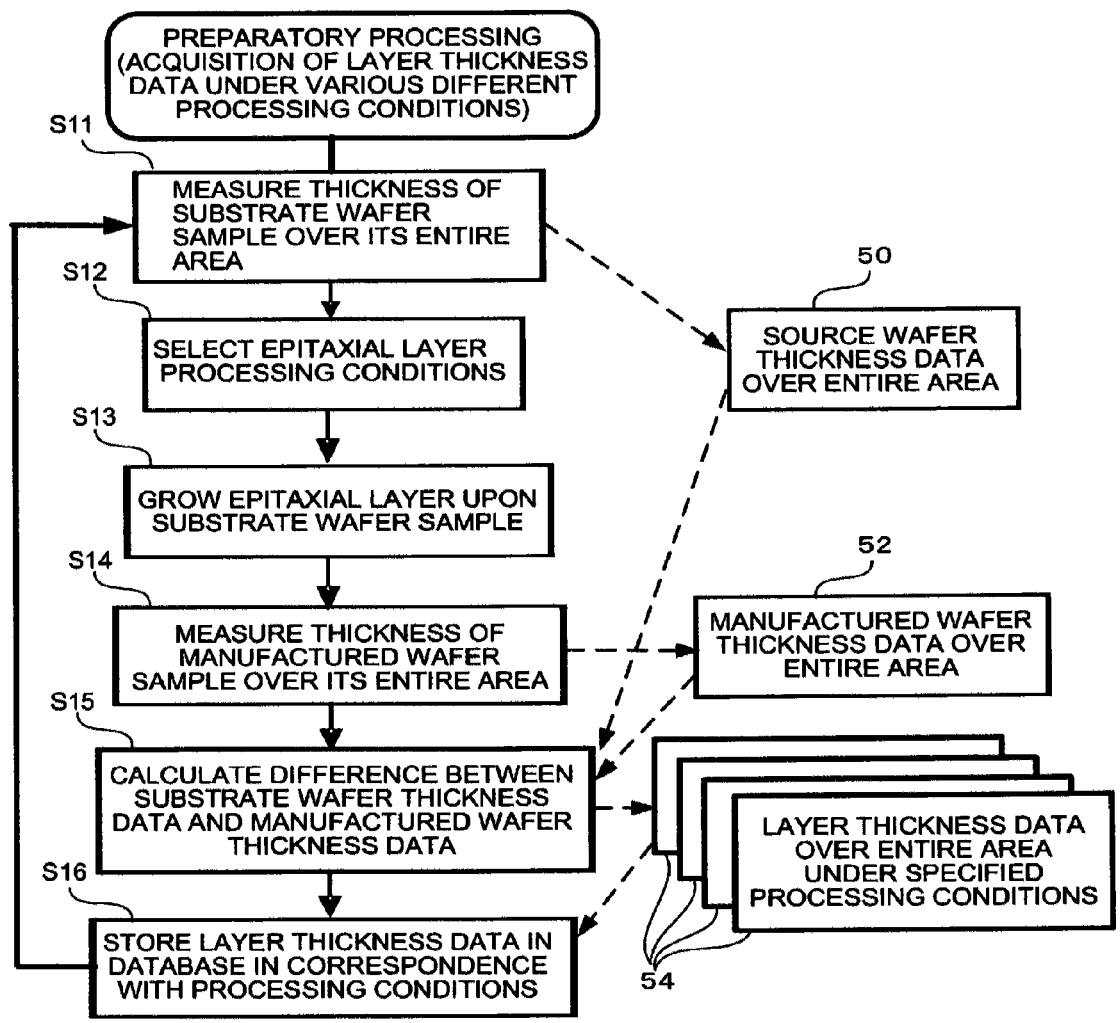
FIG. 4 is a figure showing the flow of preparatory processing in steps S1 and S2 shown in FIG. 3 (in other words, the flow of processing for acquiring epitaxial layer thickness data under various processing conditions)

FIG. 4 shows the flow of preparatory processing in the steps S1 and S2 shown in FIG. 3 (in other words, the flow of the processing for acquisition of epitaxial layer thickness data under various different processing conditions). Moreover, in FIG. 1, the dotted arrows show the flows of the semiconductor wafers during the preparatory processing.

As shown in FIG. 1, in the preparatory processing, a plurality of substrate wafers 20, 20, . . . are prepared (these substrate wafers 20, 20, . . . will hereinafter be termed the "substrate wafer samples", in order to distinguish them from the substrate wafers 30, 30, . . . which are used in the actual manufacturing process). And the processing of the steps S11 through S16 shown in FIG. 4 is performed upon each of these substrate wafer samples 20.

Referring to FIGS. 1 and 4, first, in the step S11, each of the substrate wafer samples 20 is loaded into the flatness measurement device 12, and the thickness of this substrate wafer sample 20 is measured at the large number of measurement points 42, 42, . . . over its entire area (refer to FIG. 2). As a result, substrate wafer sample thickness data 50 which specifies the thickness profile over substantially the entire area of this substrate wafer sample 20 is inputted from the flatness measurement device 12 to the control device 16.

Next in a step S12, from among a plurality of different sets of processing conditions which have been prepared in advance (different ones of the epitaxial layer growth reactors 14, 14, . . . and different combinations of operational conditions), the control device 16 selects processing conditions of one type (i.e. a combination of one specified epitaxial layer growth reactor 14 and operational conditions of one specified type), and sets these selected operational conditions which have been selected to the epitaxial layer growth reactor 14 which has been selected.

Then in a step S13 this substrate wafer sample 20 whose thickness was measured in the step S11 is loaded into the epitaxial layer growth reactor 14 which has been selected as described above, and an epitaxial layer is formed upon this substrate wafer sample 20 under the processing conditions which were selected as described above.

Then in a step S14 the manufactured wafer 22, upon which the formation of the epitaxial layer has been completed, is extracted from the epitaxial layer growth reactor 14 which was selected as described above, and this wafer is loaded for a second time into the flatness measurement device 12 (this manufactured wafer 22 will hereinafter be termed the "manufactured wafer sample", in order to distinguish it from a manufactured wafer 32 which has been manufactured by the actual manufacturing process). And the thickness of this manufactured wafer sample 22 is measured at the large number of measurement points 42, 42, . . . over its entire area (refer to FIG. 2). As a result, manufactured wafer thickness data 50 which specifies the thickness profile over substantially the entire area of this manufactured wafer sample 22 is inputted from the flatness measurement device 12 to the control device 16.

Figure 5A:
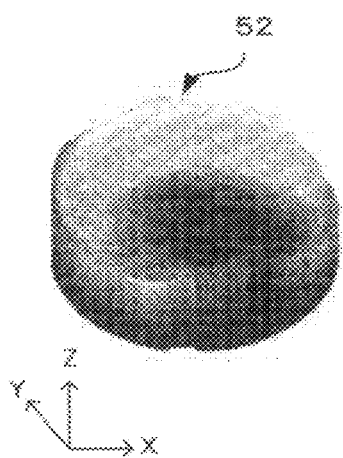
FIG. 5 is a figure for graphical explanation of a method of calculating the layer thickness data.
Figure 5B:
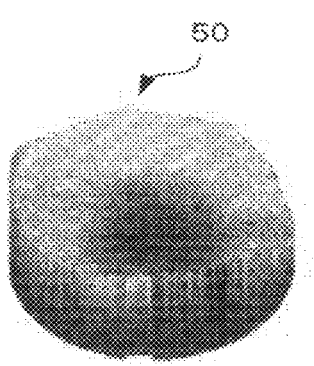
Figure 5C:
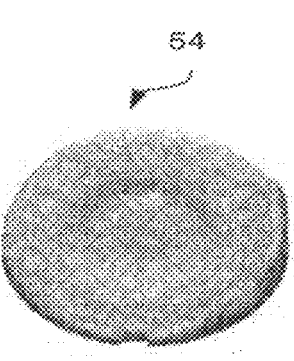

Then in a step S15 the control device 16 calculates the difference between the substrate wafer thickness data 50 and the manufactured wafer thickness data 52 (in other words, the processing amount due to the process of growing the epitaxial layer, i.e. the thickness profile of the epitaxial layer). As a result, layer thickness data 54 is obtained which specifies the thickness profile of the epitaxial layer itself over its entire area, under the processing conditions selected as described above. This process is graphically shown in FIGS. 5A through 5C. The layer thickness data 54 of the epitaxial layer is obtained by subtracting the substrate wafer thickness data 50 shown in FIG. 5B from the manufactured wafer thickness data shown in FIG. 5A.

Thereafter in a step S16 the control device 16 stores this layer thickness data 54 which has been calculated in the data base 18, in correspondence with processing conditions data which specifies the specified processing conditions described above.

The processing of the steps S11 through S16 described above is repeated for each of the sets of processing conditions of a predetermined plurality of types. The result is that, as shown in FIG. 4, a plurality of sets of layer thickness data 54, 54, . . . are accumulated in the database 18, corresponding respectively to the plurality of sets of processing conditions of various types.

It should be understood that, in order to obtain the layer thickness data 54 under processing conditions of one type, it would also be acceptable to repeat the steps S11 through S16 described above upon a plurality of substrate wafer samples 20, 20, . . . under the same processing conditions, and to calculate the average of the plurality of sets of layer thickness data which are obtained as a result.

FIG. 6 shows an example of the structure of layer thickness data and processing conditions data which are held in mutual correspondence in the database 18.

As shown in FIG. 6, a processing conditions ID 56 for identifying the processing conditions which were applied is appended to the layer thickness data, and moreover the same processing conditions ID 56 is appended to the processing conditions data 60 which specify these processing conditions. This same processing conditions ID is set into correspondence with the layer thickness data 54 and the processing conditions data 60.

The layer thickness data 54 is a set of a large number of three dimensional vectors (X values, Y values, and Z values) which respectively correspond to the large number of measurement points 42, for example those shown in FIG. 2. The X and Y values of each of these vectors specify the X coordinate values and the Y coordinate values of the corresponding measurement point 42, and its Z value specifies the layer thickness at that measurement point 42. The processing conditions data 60 includes a growth reactor ID for identifying the epitaxial layer growth reactor 14 to be used, and operational condition data which specifies the operational conditions described previously, such as the temperature conditions, the susceptor conditions, the gas conditions, and the like.

FIG. 7 shows the flow of processing in the step S3 of the actual manufacturing process shown in FIG. 3, in other words shows the flow of processing for predicting the thickness profile of the manufactured wafer under different processing conditions. Moreover, in FIG. 1, the single dotted broken line arrows show the flows of the semiconductor wafers during this sub-processing.

As shown in FIG. 1 and FIG. 7, in a step S21, each of the substrate wafers 30 which has been prepared for the actual manufacturing processing is loaded into the flatness measurement device 12, and the thickness of this substrate wafer 30 is measured at each of the large number of measurement points 42, 42, . . . over its entire area (refer to FIG. 2). As a result, substrate wafer thickness data 70 which specifies the thickness profile of this substrate wafer 30 over substantially its entire area is inputted from the flatness measurement device 12 to the control device 16.

Then in a step S22 the control device 16 reads from the database 18 the above described plurality of sets of epitaxial layer thickness data 54, 54, . . . under the above described plurality of different sets of processing conditions, and adds these sets of epitaxial layer thickness data 54 under these sets of processing conditions to the substrate wafer thickness data 70 which was obtained in the step S21. As a result, a plurality of sets of manufactured wafer thickness data 72, 72 . . . are obtained, specifying the thickness profiles of the manufactured wafers which it is predicted would be obtained, if epitaxial layers were to be grown under the respective sets of the plurality of sets processing conditions described above.

The processing of this step S22 is shown graphically in FIGS. 8A through 8C.

In FIG. 8A, the epitaxial layer thickness data 54 under the processing conditions A is added to the substrate wafer thickness data 70, and thereby predicted manufactured product layer thickness data 72 under the processing conditions A is obtained. In FIG. 8B, the epitaxial layer thickness data 54 under other processing conditions B is added to the substrate wafer thickness data 70, and thereby predicted manufactured product layer thickness data 72 under the processing conditions B is obtained. And in FIG. 8C, the epitaxial layer thickness data 54 under yet other processing conditions C is added to the substrate wafer thickness data 70, and thereby predicted manufactured product layer thickness data 72 under the processing conditions. C is obtained.

By doing this, in relation to the single substrate wafer 30, different layer thickness profiles are predicted for the resulting manufactured wafer 32, if it is processed under different processing conditions.

Figure 9:
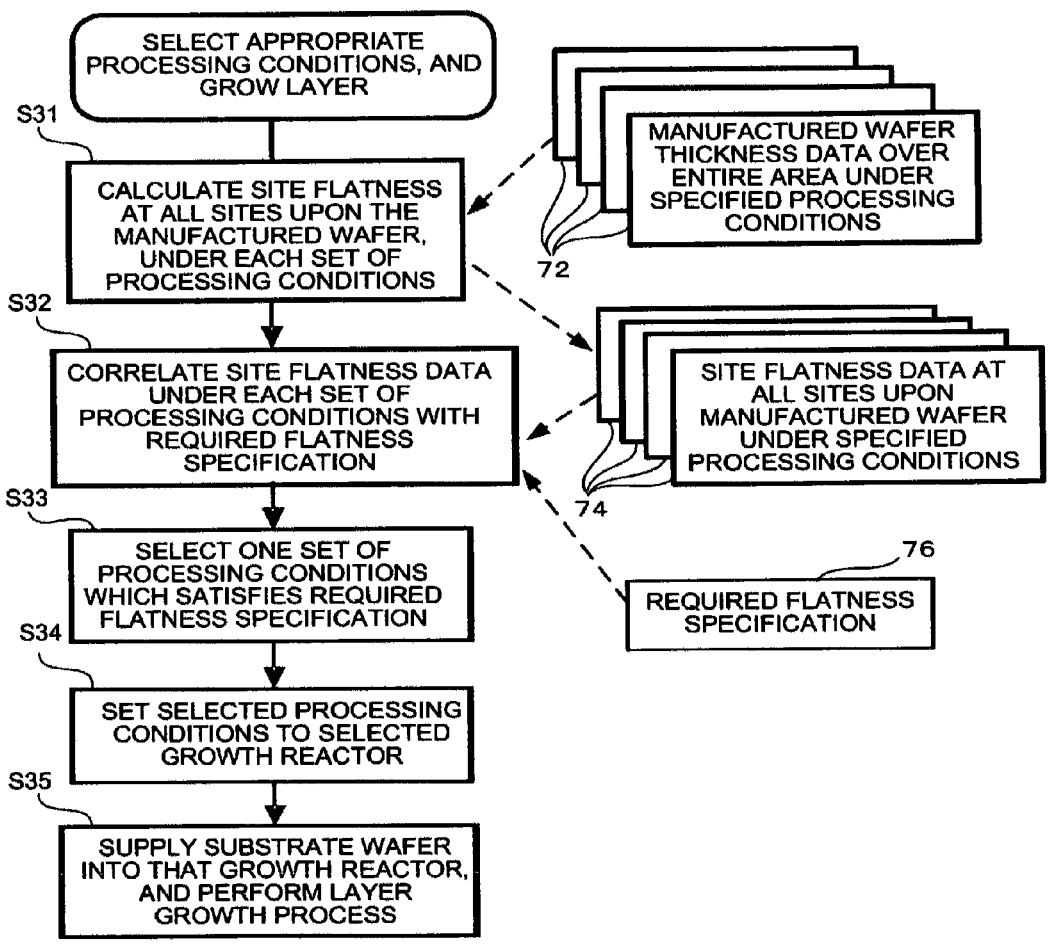
FIG. 9 is a figure showing the flow of processing in the steps S4 and S5 of the actual manufacturing processing shown in FIG. 3, in other words processing for selecting the most appropriate processing conditions and for actually forming the epitaxial layer.

FIG. 9 shows the flow of processing in the steps S4 and S5 in the actual manufacturing processing shown in FIG. 3, in other words for selecting appropriate processing conditions and for forming the epitaxial layer. Moreover, in FIG. 1, the double dotted broken line arrows show the flows of the semiconductor wafers during this sub-processing.

As shown in FIG. 9, in a step S31, on the basis of each of the sets of manufactured wafer thickness data 72, 72, under the plurality of sets of processing conditions of different types as predicted in the step S22 of FIG. 7, the control device 16 calculates an evaluated flatness value, for example the site flatness (for example SFQR (Site flatness Front reference least sQuare Range) over the entire area of the manufactured wafer (i.e. at all of its sites). As a result, sets of flatness data 74, 74, . . . are obtained which specify the respective predicted values of the flatness at all of the sites, under each of this plurality of sets of processing conditions.

Then in a step S32 the control device 16 compares the sets of site flatness data 74, 74, . . . under the above described plurality of sets of processing conditions with the flatness specification data 76 which has been prepared in advance, and which specifies a required flatness specification (for example, which includes an acceptable value of site flatness, and the minimum value of a yield ratio (flatness yield ratio) at which the site flatness better than the acceptable value is yielded, etc.), and also compares those site flatness data 74, 74, . . . with each other with respect to the quality of site flatness (for example, the flatness yield ratio). And, in a step S33, on the basis of the result of those comparisons, one set of processing conditions which satisfies the required flatness specification is selected. At this time, if there are a plurality of sets of processing conditions which satisfy the required flatness specification, then, among them, those processing conditions may be selected which yield the best flatness. For example, in the case of the examples shown in FIGS. 8A through 8C, the conditions A shown in FIG. 8A may be selected.

It should be understood that, in practice, in many cases, it is not necessarily required to select those processing conditions which yield the best flatness, provided that the required flatness specification is satisfied, which is sufficient. Accordingly if for example, in the examples shown in FIGS. 8A through 8C, only the condition C is outside the required flatness specification, then either of the sets of conditions A and B may be selected. In this case, the most appropriate processing conditions may be selected according to some aspect other than flatness, for example, according to the aspect of reduction of the number of times that the processing conditions are changed, increasing the productivity, simplifying the control, lowering the cost, enhancing the quality of the final manufactured product, or the like.

Then in a step S34 the operational conditions which are specified by the selected processing conditions are set to that epitaxial growth reactor 14 which is specified by those selected processing conditions. And in a step S35 the substrate wafer 30, whose thickness was measured in the step S21 of FIG. 7, is loaded into this epitaxial growth reactor 14, and an epitaxial layer is formed upon this substrate wafer 30 under the operational conditions which have been set.

The sub-processes shown in FIGS. 8 and 9 are repeated for a large number of substrate wafers 30, 30, . . . which have been prepared, and thereby a large number of manufactured wafers 32, 32, . . . are produced.

Figure 10:
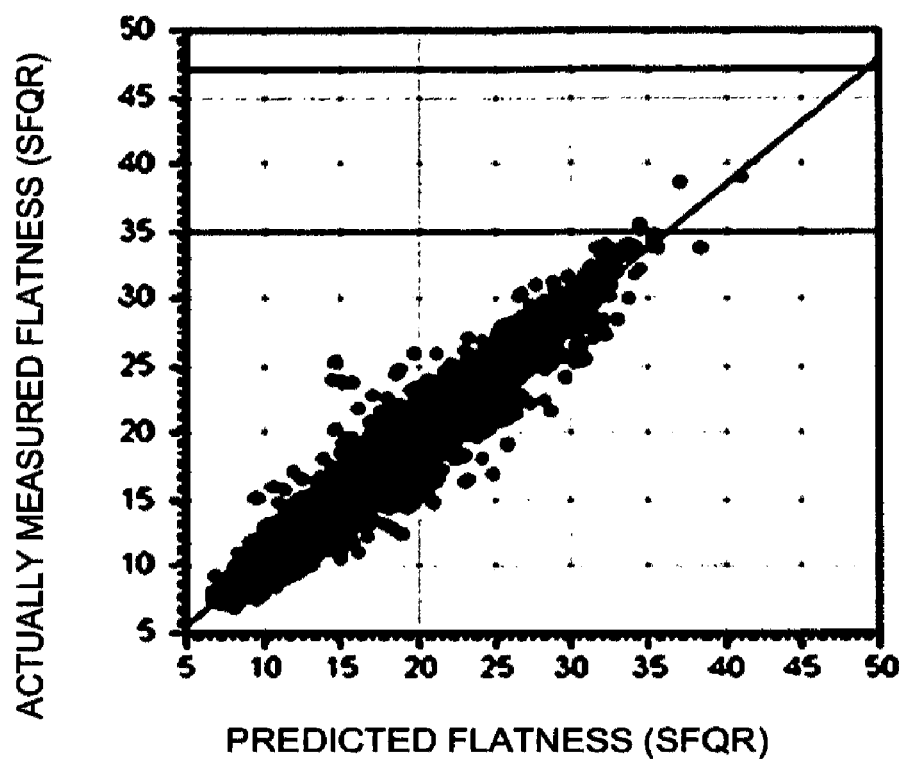
FIG. 10 is a figure showing a relationship between actually measured flatness and predicted flatness.

FIG. 10 shows a relationship between site flatness at all sites, as actually measured from manufactured wafers actually produced under various different processing conditions (i.e. actually measured flatness), and site flatness at all sites of a wafer manufactured under the same processing conditions, as calculated in the step S31 of FIG. 9 described above (i.e. predicted flatness) (SFQR was employed for site flatness).

As will be understood from FIG. 10, an extremely high correlation exists between the predicted flatness and the actually measured flatness. This fact means that, according to this embodiment, it is possible to predict the flatness over the entire area of the manufactured wafer at high accuracy. Thus, according to this embodiment, it is possible to manufacture an epitaxial wafer having satisfactory flatness.

FIGS. 11A through 11C relate to a case in which attention is directed to some one site, and graphically show the substrate wafer thickness data 70 measured in the step S21 of FIG. 4 described above, the epitaxial layer thickness data 54 measured in the step S15 of FIG. 4 described above, and the manufactured wafer thickness data 72 predicted in the step S22 of FIG. 7 described above.

In FIGS. 11A through 11C, the rectangular region 80 denotes a region around a single site, and the distance 76 between the upper and lower rectangles denotes the required flatness specification.

As will be understood from FIGS. 11A through 11C, according to this embodiment, by selecting the processing conditions according to the circumstances, it is possible for the flatness of the manufactured wafer (refer to FIG. 11C) to surpass the flatness of the substrate wafer (refer to FIG. 11A).

According to this embodiment, since it is possible to predict the thickness profile of the wafer at high accuracy, not only at its border portion but over its entire area, accordingly it is possible to predict the flatness yield ratio of the manufactured wafer before growing the epitaxial layer, and therefore it is possible to determine the most appropriate processing conditions. By doing this, it is possible to increase the flatness of the manufactured wafer, to enhance the flatness yield rate, and to implement cost reduction due to stabilization.

Moreover, according to this embodiment, since it is possible to find processing conditions under which the required flatness specification is obtained, even if they are not the absolutely best processing conditions, accordingly it is possible to reduce adjustment or change of the processing conditions to the necessary minimum.

Although a preferred embodiment of the present invention has been explained above, this is has only been shown for explanation of the present invention; the scope of the present invention is not to be considered as being limited only to this embodiment. The present invention may be implemented in various modes other than the embodiment described above, provided that its gist is not deviated from.

For example while, as described in the above embodiment, the present invention is principally effective in order to improve the flatness of a manufactured wafer after layer growth, the present invention can be applied, not only to the above, but also for amelioration of the bending (warping) of a wafer which accompanies layer growth thereof, by including the amount of such bending as a processing amount. In this case, during the preparatory processing, not only should the thicknesses of the wafer (the distances between its front surface and its rear surface) be measured at time points before and after layer growth, but also the bending shape of the wafer should be measured (for example the intrinsic shape of its front surface).

Moreover the present invention can also be applied, not only to growth of a layer, but also in relation to processing such as grinding or etching or the like. In this case, in the preparatory processing, the difference of the wafer thickness data which is measured at the time points before and after the processing such as grinding or etching or the like is performed will mean the thickness which is removed by the processing (i.e. the processing amount).

The invention claimed is:

1. A semiconductor wafer manufacturing device, comprising:
   a storage means which stores a plurality of sets of processing amount data which specify respective processing amounts over substantially the entire area of a wafer under a plurality of sets of processing conditions;
   a substrate wafer measurement means which obtains substrate wafer flatness profile data by measuring the flatness of a substrate wafer over substantially its entire area;
   a manufactured wafer prediction means which, by applying each of said plurality of sets of processing amount data to said substrate wafer flatness profile data, calculates a plurality of sets of manufactured wafer flatness profile data, each of which specifies predicted values for flatness profile of a manufactured wafer over substantially its entire area, which would be obtained if said substrate wafer were to be processed under said plurality of sets of processing conditions;
   a processing conditions selection means which evaluates said plurality of sets of processing conditions on the basis of said plurality of sets of manufactured wafer flatness profile data, and selects one set of processing conditions according to the result of said evaluation;
   a wafer processing means which manufactures a manufactured wafer by processing said substrate wafer under said selected one set of processing conditions;
   a flatness measurement device which can measure wafer flatness;
   an epitaxial layer growth reactor which operates under set processing conditions; and
   a control device for inputting output data from said flatness measurement device, and controlling said epitaxial layer growth reactor;
   wherein:
   said flatness measurement device functions as said substrate wafer measurement means;
   said epitaxial layer growth reactor functions as said wafer processing means; and
   said control device functions as said storage means, said manufactured wafer prediction means, and said processing conditions selection means.

2. A semiconductor wafer manufacturing device according to claim 1, further comprising:
   a substrate wafer sample measurement means which obtains a plurality of substrate wafer flatness profile data by measuring the flatness profiles of a plurality of substrate wafer samples over substantially their entire areas;
   a sample processing means which manufactures a plurality of manufactured wafer samples by processing each of said plurality of substrate wafer samples under one of said plurality of sets of processing conditions;
   a manufactured wafer sample measurement means which obtains a plurality of sets of manufactured wafer flatness profile data by measuring the flatness profiles of said plurality of manufactured wafer samples over substantially their entire areas; and
   a processing amount calculation means which calculates said plurality of sets of processing amount data from said plurality of sets of substrate wafer flatness profile data and said plurality of sets of manufactured wafer flatness profile data.

3. A semiconductor wafer manufacturing device according to claim 1, wherein, on the basis of said plurality of sets of manufactured wafer flatness profile data, said processing condition selection means calculates a plurality of corresponding flatness profile evaluation values, and selects said one set of processing conditions which satisfy a predetermined flatness profile specification by comparing said plurality of calculated flatness profile evaluation values with said predetermined flatness profile specification.

4. A semiconductor wafer manufacturing device according to any one of claims 1 through 3, wherein:
   said processing is growth of an epitaxial layer;
   said processing amounts are the thickness of that epitaxial layer; and
   said flatness profile is a wafer thickness profile.

5. A semiconductor wafer manufacturing device according to claim 1 wherein the flatness measured to obtain the substrate wafer flatness profile data is wafer thickness constituting distance between a front surface and a back surface of the wafer.

6. A semiconductor wafer manufacturing device according to claim 1 wherein the flatness measured to obtain the substrate wafer flatness profile data is displacement of a front surface of the wafer and includes displacement due to bending of the wafer.

7. A semiconductor wafer manufacturing device according to claim 1 wherein the processing amounts specified by the processing amount data are changes in wafer thickness due to said processing as measured between a front surface and a back surface of the wafer.

8. A semiconductor wafer manufacturing device according to claim 1 wherein the processing amounts specified by the processing amount data are changes in displacement of a front surface of the wafer due to said processing and include changes in displacement due to changes in bending of the wafer.

9. A semiconductor wafer manufacturing device according to claim 1 wherein the processing conditions selection means evaluates flatness through utilization of at least one species selected from among the group consisting of SFQR (Site flatness Front reference least sQuare Range), SFQD (Site flatness-Front reference least sQuare Deviation), SBIR (Site flatness Back reference Ideal Range), SBID (Site flatness Back reference Ideal Deviation), SFLR (Site flatness Front reference Least square Range), and SFLD (Site flatness Front reference Least square Deviation).

10. A semiconductor wafer manufacturing device, comprising:
    a storage means which stores a plurality of sets of processing amount data which specify respective processing amounts over substantially the entire area of a wafer under a plurality of sets of processing conditions;

a substrate wafer measurement means which obtains substrate wafer flatness profile data by measuring the flatness of a substrate wafer over substantially its entire area;

a manufactured wafer prediction means which, by applying each of said plurality of sets of processing amount data to said substrate wafer flatness profile data, calculates a plurality of sets of manufactured wafer flatness profile data, each of which specifies predicted values for flatness profile of a manufactured wafer over substantially its entire area, which would be obtained if said substrate wafer were to be processed under said plurality of sets of processing conditions;

a processing conditions selection means which evaluates said plurality of sets of processing conditions on the basis of said plurality of sets of manufactured wafer flatness profile data, and selects one set of processing conditions according to the result of said evaluation;

a wafer processing means which manufactures a manufactured wafer by processing said substrate wafer under said selected processing conditions;

a flatness measurement device which can measure wafer thickness;

an epitaxial layer growth reactor which operates under set processing conditions; and a control device for inputting output data from said flatness measurement device, and controlling said epitaxial layer growth reactor;

wherein:

said flatness measurement device functions as said substrate wafer measurement means;

said epitaxial layer growth reactor functions as said wafer processing means; and said control device functions as said storage means, said manufactured wafer prediction means, and said processing conditions selection means;

said processing is growth of an epitaxial layer;

said processing amounts are the thickness of that epitaxial layer; and said flatness profile is a wafer thickness profile.

11. A semiconductor wafer manufacturing method, comprising:

a storage step of storing a plurality of sets of processing amount data which specify respective processing amounts over substantially the entire area of a wafer under a plurality of sets of processing conditions;

a substrate wafer measurement step of obtaining substrate wafer flatness profile data by measuring the flatness of a substrate wafer over substantially its entire area;

a manufactured wafer prediction step of, by applying each of said plurality of sets of processing amount data to said substrate wafer flatness profile data, calculating a plurality of sets of manufactured wafer flatness profile data, each of which specifies predicted values for flatness profile of a manufactured wafer over substantially its entire area, which would be obtained if said substrate wafer were to be processed under said plurality of sets of processing conditions;

a processing conditions selection step of evaluating said plurality of sets of processing conditions on the basis of said plurality of sets of manufactured wafer flatness profile data, and selecting one set of processing conditions according to the result of said evaluation; and a wafer processing step of manufacturing a manufactured wafer by processing said substrate wafer under said selected one set of processing conditions;

wherein:

a flatness measurement device which can measure wafer flatness is employed at the substrate wafer measurement step to obtain the substrate wafer flatness profile data;

an epitaxial layer growth reactor which operates under said selected one set of processing conditions is employed at the wafer processing step to manufacturer the manufactured wafer; and a control device for inputting output data from said flatness measurement device and for controlling said epitaxial layer growth reactor is employed at the storage step to store the plurality of sets of processing amount data, is employed at the manufactured wafer prediction step to calculate the plurality of sets of manufactured wafer flatness profile data, and is employed at the processing conditions selection step to evaluate said plurality of sets of processing conditions and to select said selected one set of processing conditions.

12. A semiconductor wafer manufacturing device, comprising:

a control device;

a flatness measurement device; and an epitaxial layer growth reactor; wherein said control device stores a plurality of sets of processing amount data which specify respective processing amounts over substantially the entire area of a wafer under a plurality of sets of processing conditions;

said flatness measurement device obtains substrate wafer flatness profile data by measuring the flatness of a substrate wafer over substantially its entire area;

said control device, by applying each of said plurality of sets of processing amount data to said substrate wafer flatness profile data, calculates a plurality of sets of manufactured wafer flatness profile data, each of which specifies predicted values for flatness profile of a manufactured wafer over substantially its entire area, which would be obtained if said substrate wafer were to be processed under said plurality of sets of processing conditions;

said control device evaluates said plurality of sets of processing conditions on the basis of said plurality of sets of manufactured wafer flatness profile data, and selects one set of processing conditions according to the result of said evaluation; and said epitaxial layer growth reactor manufactures a manufactured wafer by processing said substrate wafer under said selected one set of processing conditions.

* * * * *